United States Patent
Zhou

(10) Patent No.: US 9,330,964 B2
(45) Date of Patent: May 3, 2016

(54) SEMICONDUCTOR STRUCTURES AND FABRICATION METHODS FOR IMPROVING UNDERCUT BETWEEN POROUS FILM AND HARDMASK FILM

(71) Applicant: Semiconductor Manufacturing International (Shanghai) Corporation, Shanghai (CN)

(72) Inventor: Ming Zhou, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/140,939

(22) Filed: Dec. 26, 2013

(65) Prior Publication Data

US 2015/0035152 A1  Feb. 5, 2015

(30) Foreign Application Priority Data

Jul. 24, 2013  (CN) .......................... 2013 1 0315154

(51) Int. Cl.
*H01L 21/4763*  (2006.01)
*H01L 21/302*  (2006.01)
*H01L 21/768*  (2006.01)
*H01L 23/532*  (2006.01)
*H01L 21/02*  (2006.01)
*H01L 21/311*  (2006.01)
*H01L 23/522*  (2006.01)

(52) U.S. Cl.
CPC .... *H01L 21/76802* (2013.01); *H01L 21/02063* (2013.01); *H01L 21/02126* (2013.01); *H01L 21/02211* (2013.01); *H01L 21/02274* (2013.01); *H01L 21/31144* (2013.01); *H01L 23/5329* (2013.01); *H01L 23/53295* (2013.01); *H01L 23/5226* (2013.01); *H01L 2924/0002* (2013.01)

(58) Field of Classification Search
CPC .......................... H01L 21/302; H01L 21/4763
USPC .................................. 257/751; 438/710, 740
See application file for complete search history.

(56) References Cited

U.S. PATENT DOCUMENTS

| | | | |
|---|---|---|---|
| 6,331,479 B1 * | 12/2001 | Li ..................... | H01L 21/31144 257/E21.257 |
| 6,472,231 B1 * | 10/2002 | Gabriel et al. .................... | 438/9 |
| 2002/0000556 A1 * | 1/2002 | Sakamoto ............. | C04B 35/583 257/66 |
| 2002/0001939 A1 * | 1/2002 | Kinoshita et al. ............. | 438/622 |
| 2004/0175935 A1 * | 9/2004 | Abell ............................. | 438/638 |
| 2004/0251547 A1 * | 12/2004 | Wu et al. ....................... | 257/751 |
| 2006/0006140 A1 * | 1/2006 | Lakshmanan et al. .......... | 216/67 |
| 2007/0264820 A1 * | 11/2007 | Liu et al. ....................... | 438/624 |

(Continued)

*Primary Examiner* — Jerome Jackson, Jr.
*Assistant Examiner* — Lamont Koo
(74) *Attorney, Agent, or Firm* — Anova Law Group, PLLC

(57) ABSTRACT

A method is provided for fabricating a semiconductor structure. The method includes providing a substrate; and forming a to-be-etched layer made of porous low dielectric constant material on one surface of the semiconductor substrate. The method also includes forming a first hard mask layer made of nitrogen-doped silicon oxycarbide (SiOC(N)) on the to-be-etched layer; and etching the first hard mask layer to have patterns corresponding to positions of subsequently formed openings. Further, the method includes forming the plurality of openings without substantial undercut between the to-be-etched layer and the first hard mask layer in the to-be-etched layer using the first hard mask layer as an etching mask; and forming a conductive structure in each of the openings.

19 Claims, 4 Drawing Sheets

(56) References Cited

U.S. PATENT DOCUMENTS

| | | | |
|---|---|---|---|
| 2008/0020570 A1* | 1/2008 | Naik | 438/675 |
| 2008/0283975 A1* | 11/2008 | Matz et al. | 257/642 |
| 2010/0133660 A1* | 6/2010 | Huyghebaert et al. | 257/621 |
| 2010/0301491 A1* | 12/2010 | Yang | 257/773 |
| 2013/0200431 A1* | 8/2013 | Coimbatore Balram et al. | 257/183 |

* cited by examiner

SEMICONDUCTOR STRUCTURES AND FABRICATION METHODS FOR IMPROVING UNDERCUT BETWEEN POROUS FILM AND HARDMASK FILM

CROSS-REFERENCES TO RELATED APPLICATIONS

This application claims the priority of Chinese patent application No. 201310315154.5, filed on Jul. 24, 2013, the entirety of which is incorporated herein by reference.

FIELD OF THE INVENTION

The present invention generally relates to the field of semiconductor manufacturing technology and, more particularly, relates to semiconductor structures and fabrication techniques thereof.

BACKGROUND

With the development on the integrated circuit (IC) technology, the integration level of semiconductor devices has been continuously improved, which causes the number of conductive structures in a circuit to significantly increase; and the distances between the conductive structures to decrease. Thus, a resistive capacitive delay (RC delay) effect caused by parasitic capacitances and parasitic resistances becomes more severe. In order to reduce the RC delay effect caused by the parasitic capacitances and the parasitic resistances, low dielectric constant (low-K) materials are used to isolate the conductive structures. The low-K material reduces the parasitic capacitances between the conductive structures, thus the RC delay effect caused by the parasitic capacitances and parasitic resistances is reduced.

FIGS. 1~4 illustrate semiconductor structures corresponding to certain stages of an exemplary process for forming a conductive structure with a low-K dielectric layer.

As shown in FIG. 1, the process includes providing a semiconductor substrate 100 having semiconductor devices (not shown) formed inside; and forming a low-K dielectric layer 101 on one surface of the semiconductor substrate 100.

Further, as shown in FIG. 2, the process also includes forming a buffer layer 102 on the top surface of the low-K dielectric layer 101; forming a hard mask layer 103 on the top surface of the buffer layer 102; forming a titanium nitride (TiN) layer 104 on the top surface of the hard mask layer 103; and forming a patterned photoresist layer 105 on the top surface of the TiN layer 104. The buffer layer 102 is made of silicon oxynitride (SiON); and may be referred a hard mask buffer layer (HMBD). The hard mask layer 103 is made of tetraethyl orthosilicate (TEOS); and may refer to a HDTEOS layer Further, as shown in FIG. 3, the process includes etching the TiN layer 104, the hard mask layer 103 and the buffer layer 102 until the surface of the low-K dielectric layer 101 is exposed using the patterned photoresist layer 105 as an etching mask; and etching the low-K dielectric layer 101 until the surface of the semiconductor substrate 100 is exposed using the etched TiN layer 104, the etched hard mask layer 103 and the etched buffer layer 102 as an etching mask; and an opening 106 is formed in the low-K dielectric layer 101. After forming the opening 106, the photoresist layer 105 may be removed.

Further, as shown in FIG. 4, the process also includes performing a wet chemical cleaning process; and forming a conductive structure 107 in the opening 106. Specifically, a process for forming the conductive structure 107 includes forming a conductive thin film on the surface of the TiN layer 104 and filling up the opening 106 with conductive material; and polishing the conductive film until the surface of the hard mask layer 103 is exposed. Thus, the conductive structure 107 is formed.

However, sidewalls of the opening 106 often have substantial undercuts after the etching processes for forming the opening 106. After forming the conductive structure 107, voids may be formed between the conductive structure 107 and the sidewalls of the opening 106, i.e., an overhang structure. It may also be easy to form voids in the conductive structure 107. Thus, the performance of the conductive structure 107 may be unstable. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a substrate; and forming a to-be-etched layer made of porous low dielectric constant material on one surface of the semiconductor substrate. The method also includes forming a first hard mask layer made of nitrogen-doped silicon oxycarbide (SiOC(N)) on the to-be-etched layer; and etching the first hard mask layer to have patterns corresponding to positions of subsequently formed openings. Further, the method includes forming the plurality of openings without substantial undercut between the to-be-etched layer and the first hard mask layer in the to-be-etched layer using the first hard mask layer as an etching mask; and forming a conductive structure in each of the openings.

Another aspect of the present disclosure includes a semiconductor structure. The semiconductor structure includes a substrate and a to-be-etched layer made of porous low dielectric constant material formed on one surface of the substrate. The semiconductor structure also includes a first hard mask layer made of nitrogen-doped silicon oxycarbide (SiOC(N)) formed on the to-be-etched layer. Further, the semiconductor structure includes a plurality of conductive structures formed in the to-be-etched layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
FIGS. 1~4 illustrates semiconductor structures corresponding to certain stages of an exemplary fabrication process of an existing semiconductor structure.
Figure 2:
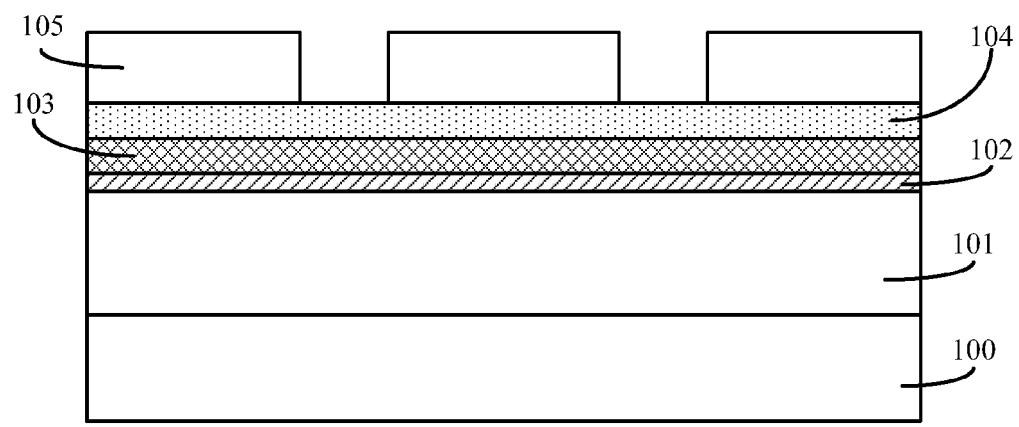
Figure 3:
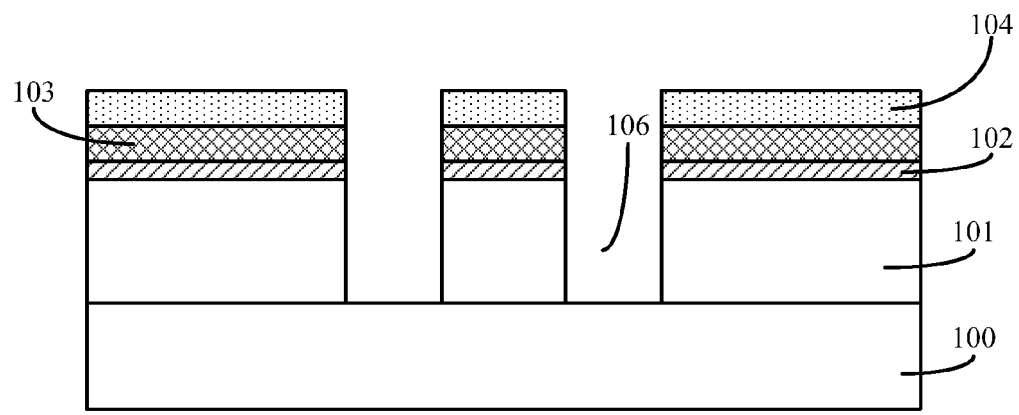
Figure 4:
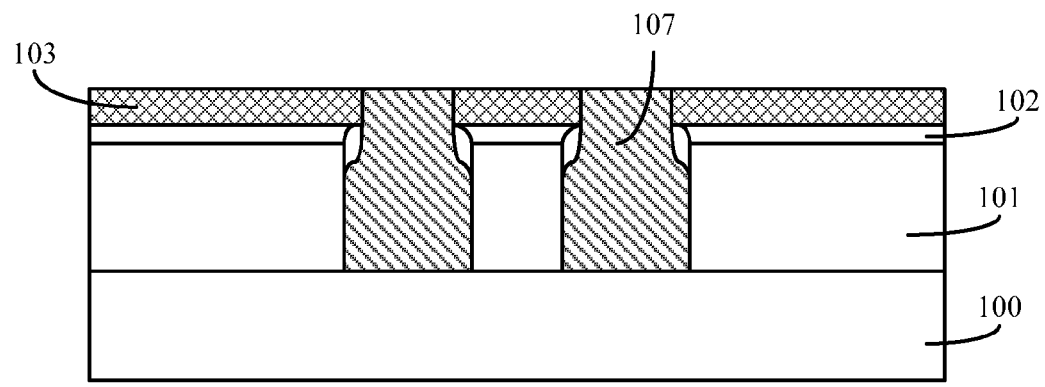

Referring to FIGS. 3-4, after forming the opening 106, a wet chemical cleaning process may be needed. Commonly used chemicals of the wet chemical cleaning process may include diluted hydrogen fluoride (HF). An etching rate of the hard mask layer 103 under an HF etching process may be slower than an etching rate of the buffer layer 102 under the HF etching process. Thus, after the wet chemical cleaning process, an undercut may be formed under the hard mask layer 103. That is, a sidewall of the etched hard mask layer 103 may protrude from a sidewall of the etched buffer layer 102. For example, when a diluted HF solution with a water to HF ratio of 200:1 is used to perform the wet chemical cleaning process, a distance between the sidewall of the etched hard mask layer 103 and the sidewall of the etched buffer layer 102 may be greater than 5 nm.

After performing the wet chemical cleaning process, a conductive material may be formed in the opening 106 by a physical vapor deposition process or an electrical chemical plating process. The conductive film may be unable to completely cover the sidewalls of the opening 106 because of the undercut, thus voids may be formed between the conductive film and the sidewalls of the opening 106. Further, it may be difficult for the conductive film to enter into the opening 106 because of the undercut, thus voids may be formed in the conductive film. Therefore, the electrical properties of the conductive structure 107 may be unable to match desired requirements.

Further, referring to FIG. 4, when the buffer layer 102 is omitted, although a distance between the surface of the low-K dielectric layer 101 and the surface of the TiN 104 may be reduced; and it may be easy for the conductive film to enter into the opening 106, the etching rate of the hard mask layer 103 under the HF etching process may be still slower than an etching rate of the low-K dielectric layer 101. After the wet chemical cleaning process, an undercut may still be formed under the hard mask layer 103. That is, a side surface the etched hard mask layer 103 may protrude from a side surface of the etched low-K dielectric layer 101. Thus, the conductive film formed in the opening 106 may still be unable to completely cover the sidewalls of the opening 106. Further, the hard mask layer 103 and the low-K dielectric layer 101 may have a relatively weak adhesion; it may be easy for the hard mask layer 103 to peel off from the low-K dielectric layer 101; and/or bend. Thus, the quality of the conductive structure formed in the opening 106 may be further reduced, and the electrical properties of the conductive structure 107 may be unable to match desired requirements. The disclosed embodiments overcome such problems by using a nitrogen-doped silicon oxycarbide layer as a hard mask layer.

Figure 8:
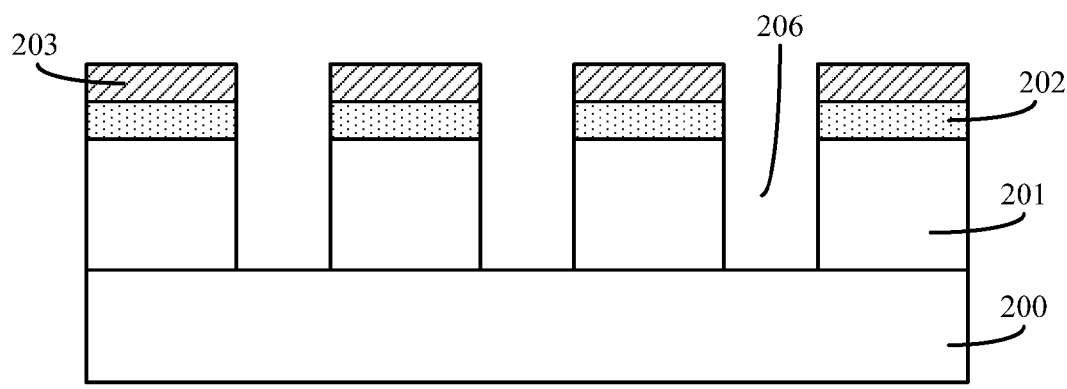
Figure 9:
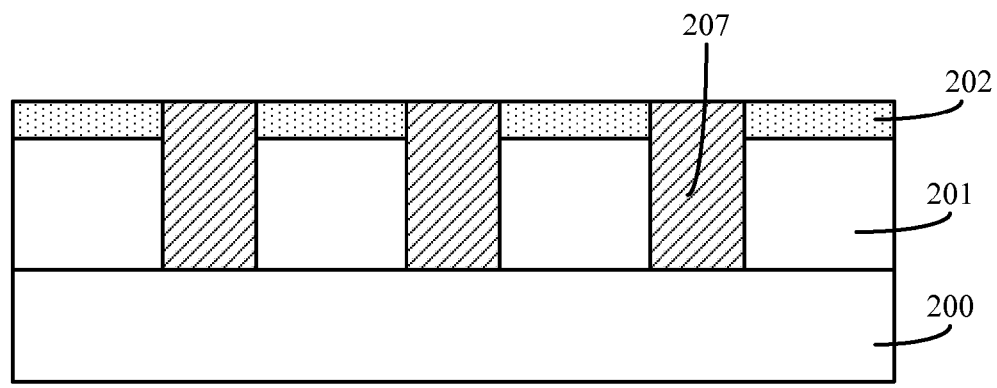
Figure 10:
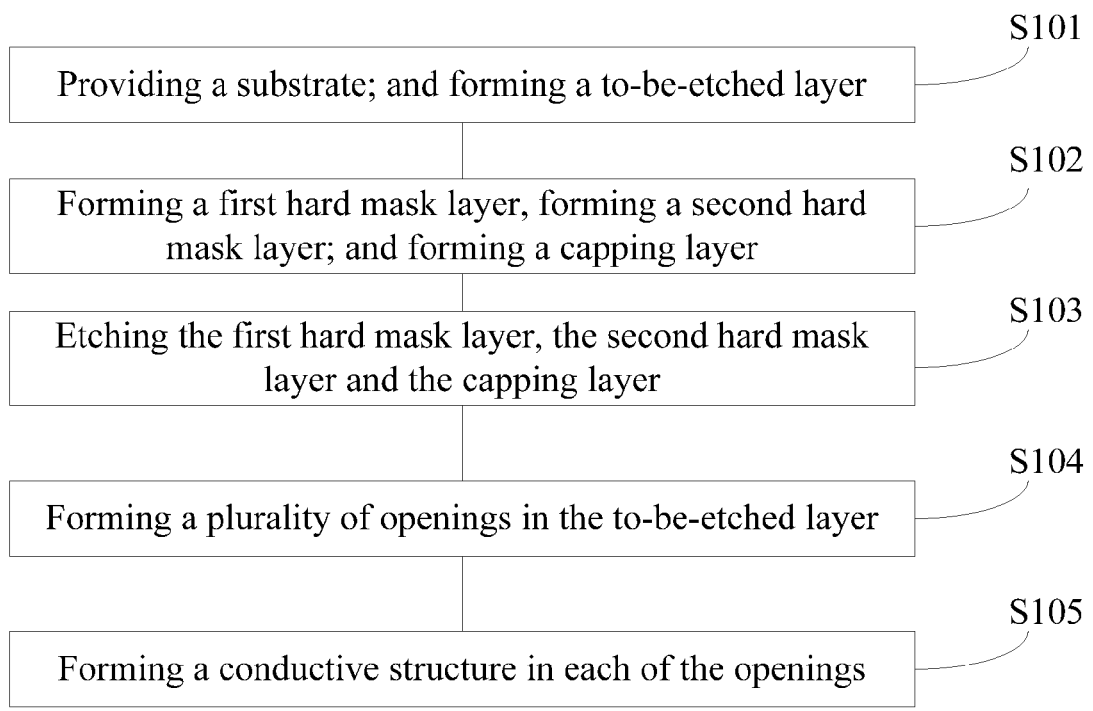
FIG. 10 illustrates an exemplary fabrication process of a semiconductor structure consistent with the disclosed embodiments.

FIG. 10 illustrates an exemplary fabrication process of a semiconductor structure consistent with the disclosed embodiments; and FIGS. 5-9 illustrate semiconductor structures corresponding to certain stages of an exemplary fabrication process for a semiconductor structure consistent with the disclosed embodiments.

Figure 5:
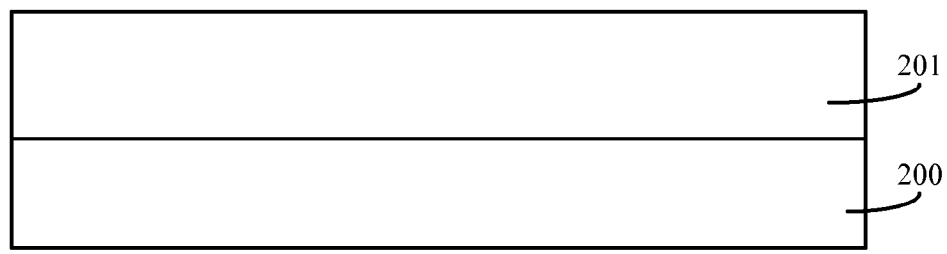
FIGS. 5-9 illustrate semiconductor structures corresponding to certain stages of an exemplary fabrication process of a semiconductor structure consistent with the disclosed embodiments.

As shown in FIG. 10, at the beginning of the fabrication process, a substrate with certain structures is provided (S101). FIG. 5 illustrates a corresponding semiconductor structure.

As shown in FIG. 5, a substrate 200 is provided; and a to-be-etched layer 201, i.e., etched by subsequent processes, may be formed on one surface of the substrate 200.

The substrate 200 may include a semiconductor substrate (not shown) and a plurality of semiconductor devices formed inside and/or in the surface of the semiconductor substrate. The semiconductor devices may be CMOS devices including transistors, memories, capacitors, or any other appropriate devices, etc. The substrate 200 may also include electrical interconnection structures electrically connecting the semiconductor devices, and isolation layers electrically isolating adjacent semiconductor devices and/or electrically isolating the semiconductor devices from the electrical interconnection structures. The substrate 200 may also include resistors formed inside and/or on the semiconductor substrate. Other devices may be included in the substrate 200; and some devices may be omitted.

The semiconductor substrate may include any appropriate semiconductor material, such as silicon, silicon on insulator (SOI), germanium on insulator (SOI), silicon germanium, carborundum, indium antimonide, lead telluride, indium arsenide, indium phosphide, gallium arsenidie, gallium antimonite, alloy semiconductor or a combination thereof. The substrate provides a base for subsequent processes and structures.

In one embodiment, an insulation layer (not shown) may be formed on the substrate 200. Surfaces of the electrical interconnection structures may be exposed by the insulation layer for subsequent connecting with other electrical interconnection structures, devices, and/or circuits formed in other structures.

In certain other embodiments, the substrate 200 may only include the semiconductor substrate. That is, no devices and structures may be formed inside and in the surface of the semiconductor substrate. The semiconductor substrate may include any appropriate semiconductor material, such as silicon, silicon on insulator (SOI), germanium on insulator (SOI), silicon germanium, carborundum, indium antimonide, lead telluride, indium arsenide, indium phosphide, gallium arsenidie, gallium antimonite, alloy semiconductor or a combination thereof.

The to-be-etched layer 201 may be made of any appropriate material. In one embodiment, the to-be-etched layer 201 may be made of a low-K material. The low-K material may refer to a material with a dielectric constant lower than approximately 4. When the low-K material is used as the to-be-etched layer 201, subsequently formed adjacent conductive structures may have low parasitic resistances, thus the RC delay caused by parasitic capacitances and parasitic resistances may be reduced when signals are being transferred in the conductive structures.

The low-K material may include thin solid film, porous material, or material with appropriate composition, etc. In one embodiment, the to-be-etched layer 201 is made of a porous low-K dielectric material. The dielectric constant of the porous low-K material may be lower than approximately 2.6.

A process for forming the porous low-K material of the to-be-etched layer 201 may include forming a solid dielectric layer, i.e., not porous, on the surface of the substrate 200; and performing a porous treatment process onto the solid dielectric layer to form the porous low-K to-be-etched layer 201.

Various processes may be used to form the solid film, such as a chemical vapor deposition (CVD) process, a physical vapor deposition (PVD) process, an atomic layer deposition (ALD) process, or a flowable chemical vapor deposition (FCVD) process, etc. In one embodiment, the solid thin film is formed by a CVD process.

The porous treatment process may include any appropriate process, such as a laser treatment process, an ultraviolet light treatment process, a thermal annealing process, or a chemical etching process, etc. In one embodiment, an ultraviolet light treatment process is used to turn the solid film to the porous low-K to-be-etched layer 201.

In certain other embodiments, the to-be-etched layer 201 may be made of other appropriate material, such as boron nitride, etc.

In certain other embodiments, an etching barrier layer (not shown) may be formed on the substrate 200 before forming the to-be-etched layer 201. The etching barrier layer may be used to prevent the surface of the substrate 200 from being damaged by subsequently etching the to-be-etched layer 201 to form through trenches, etc.

The etching barrier layer may be made of any appropriate material, such as silicon oxide, silicon nitride, silicon oxynitride, or silicon carbonitride etc.

Figure 6:
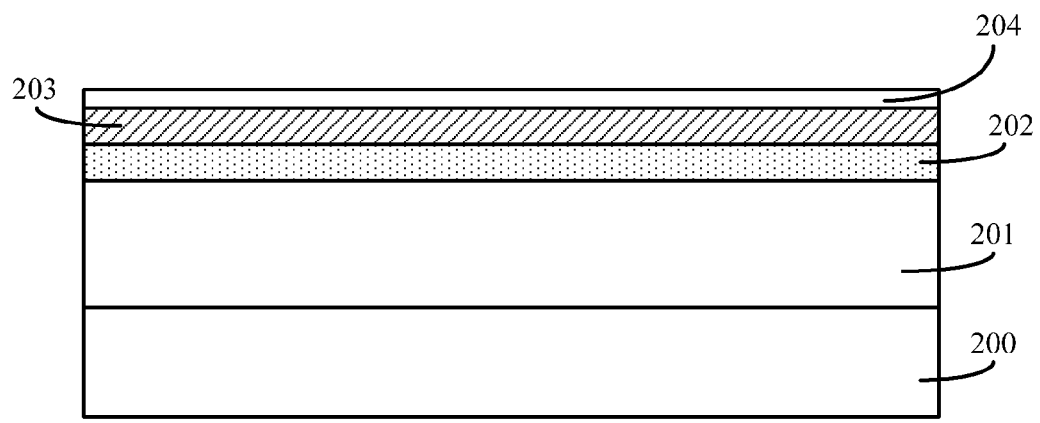

Returning to FIG. 10, after providing the substrate 200 with the to-be-etched layer 201, a first hard mask layer may be formed on the to-be-etched layer 201, a second hard mask layer may be formed on the first hard mask layer; and a capping layer may be formed on the second hard mask layer (S102). FIG. 6 illustrates a corresponding semiconductor structure.

As shown in FIG. 6, a first hard mask layer 202 is formed on the top surface of the to-be-etched layer 201; a second hard mask layer 203 is formed on the top surface of the first hard mask layer 202; and a capping layer 204 is formed on the top surface of the second hard mask layer 203.

The first hard mask layer 202 may be made of any appropriate material, such as silicon oxide, silicon nitride, silicon oxynitride, silicon carbide, or silicon oxycarbide, etc. In one embodiment, the first hard mask layer 202 is made of nitrogen-doped silicon oxycarbide [SiOC(N)].

The first hard mask layer 202 made of SiOC(N) and the to-be-etched layer 201 may have a desired adhesion, the first hard mask layer 202 may unlikely be peeled off and/or bent when the to-be-etched layer 201 is etched using an etched first mask layer 202 as an etching mask. Thus, the first mask layer 202 may have a desired ability of keeping patterns; and may aid openings formed in the to-be-etched layer 201 to have a desired morphology.

After subsequently forming the openings in the to-be-etched layer 201 by an etching process, a subsequent wet chemical cleaning process may be needed to clean by-products of the etching process on side surfaces and the bottom surfaces of the openings. A commonly used cleaning solution for the wet chemical cleaning process may be hydrogen fluoride (HF). HF may etch both the first hard mask layer 202 and the to-be-etched layer 201. Because the first hard mask layer may be made of SiOC(N); the to-be-etched layer 201 may be made of a low-K material, an etching rate of the cleaning solution to the first hard mask layer 202 and an etching rate of the cleaning solution to the to-be-etched layer 201 may be similar. Thus, after the subsequent wet chemical cleaning process, the side surface of the opening and a side surface of the etched first hard mask layer 202 may level to each other. Such a leveling of side surfaces may aid to form a conductive film completely covering the side surface of the opening. Further, it may also aid the conductive film to be dense. Therefore, properties of conductive structures formed by such a conductive film may be stable.

Further, a subsequent etching process of the to-be-etched layer 201 using the etched first hard mask layer 202 as an etching mask may be an anisotropic dry etching process. Because the first hard mask layer 202 may be made of SiOC(N), an etching rate of the dry etching process to the first hard mask layer 202 may be substantially low, patterns of the first hard mask layer may be kept stable. Thus, the obtained openings in the to-be-etched layer 201 may have a desired morphology.

Various processes may be used to form the first hard mask layer 202, such as a CVD process, a PVD process, an ALD process, or an FCVD process, etc. In one embodiment, the firs hard mask layer 202 is formed by a CVD process.

A gas source of the CVD process may include any appropriate gas. In one embodiment, the gas source of the CVD process includes $SiH_4$, $CO_2$, and $N_2O$, etc. A reaction of $SiH_4$, and $CO_2$ may form SiOC. $N_2O$ may be used to in situ dope SiOC to have a uniform distribution of N ions in SiOC. Thus, the first hard mask layer 202 made of SiOC(N) may be stable; and smooth side surfaces of the first hard layer 202 may be obtained after the wet chemical cleaning process.

A flow of $SiH_4$ of the CVD process may be in a range of approximately 10 sccm~10000 sccm. A flow of $CO_2$ of the CVD process may be in a range of approximately 10 sccm~10000 sccm. A flow of $N_2O$ of the CVD process may be in a range of approximately 10 sccm~10000 sccm. A pressure of the CVD process may be in a range 0.1 Torr~10 Torr. The power of a plasma source may be in a range of 100 W~5000 W if a plasma source is used in the CVD process.

The second hard mask layer 203 may be made of any appropriate material, such as silicon oxide, silicon nitride, titanium nitride, tantalum nitride, or aluminum nitride, etc. In one embodiment, the second hard mask layer 203 is made of titanium nitride (TiN). The second hard mask layer 203 made of TiN may have a relatively good adhesion with the first hard mask layer 202. When the to-be-etched layer 201 is subsequently etched, the second hard mask layer 203 may unlikely be etched and/or bent. The second hard mask layer 203 may be used to prevent the first hard mask layer 201 from being thinned when the to-be-etched layer 201 is subsequently etched. Further, the second hard mask layer 203 made of TiN may have a relatively strong physical strength, thus patterns in the first hard mask layer 202 and the second hard mask layer 203 may be kept stable when the to-be-etched layer 201 is subsequently etched; and openings with a good morphology may be subsequently obtained. Further, after subsequently forming a conductive layer in the openings, a polishing process may be subsequently performed; the second hard mask layer 203 may be used as a polishing stop layer. That is, when the polishing process reaches the second hard mask layer 203, a further over-polishing with a pre-determined thickness may be used to expose the first hard mask layer 202.

Various processes may be used to form the second hard mask layer 203, such as a CVD process, a PVD process, an ALD process, or an FCVD process, etc. In one embodiment, the second hard mask layer 203 is formed by a CVD process.

The capping layer 204 may be made of any appropriate material, such as silicon oxide, silicon nitride, silicon oxynitride, etc. In one embodiment, the capping layer 204 is made of silicon oxide. The capping layer 204 may be used to improve an adhesion between the second hard mask layer 203 and a subsequently formed photoresist layer. Further, the capping layer 204 may also be used to protect the second hard mask layer 203 when the photoresist layer is subsequently removed.

Various processes may be used to form the capping layer 204, such as a CVD process, a PVD process, an ALD process, or an FCVD process, etc. In one embodiment, the capping layer 204 is formed by a CVD process or an ALD process.

In certain other embodiments, only the first hard mask layer 202 may be formed on the to-be-etched layer 201; and the second hard mask layer 203 may be omitted. The capping layer 204 may be directly formed on the first mask layer 202. Because the second mask layer 203 is omitted, the fabrication process may be simplified, but a thickness of the first hard mask 202 may need to be increased to ensure a pattern stability of the first hard mask layer 202 when the to-be-etched layer 201 is subsequently etched.

Figure 7:
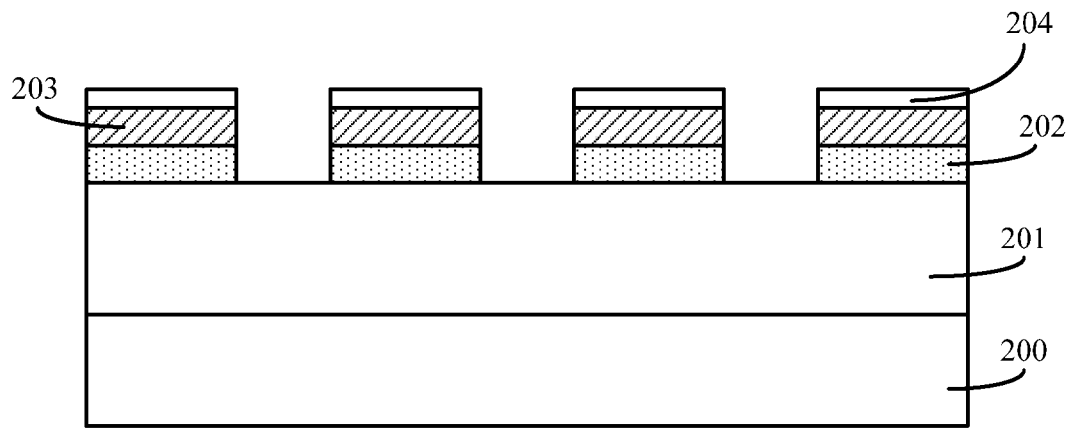

Returning to FIG. 10, after forming the capping layer 204, a portion of the first mask layer 202, a portion of the second mask layer 203, and a portion of the capping layer 204 may be etched to expose the to-be-etched layer 201 (S103). FIG. 7 illustrates a corresponding semiconductor structure.

As shown in FIG. 7, a portion of the first mask layer 202, a portion of the second mask layer 203, and a portion of the capping layer 204 are etched; a portion of the surface of the to-be-etched layer 201 is exposed.

Various processes may be used to etch the first hard mask layer 202, the second hard mask layer 203 and the capping layer 204, such as a dry etching process, a wet etching process, or an ion beam etching process, etc. In one embodiment, an anisotropic dry etching process is used to etch the first hard mask layer 202, the second hard mask layer 203 and the capping layer 204.

The portion of the capping layer 204 may be etched firstly to expose the portion of the surface of the second hard mask layer 203. The portion of the surface of the second mask layer 203 may correspond to positions of the subsequently formed openings in the to-be-etched layer 201. After etching the portion of the capping layer 204, the portion of the second hard mask layer 203 may be etched using the etched first capping layer 204 as an etching mask. Then, the portion of the first mask layer 202 may be etched using the etched second hard mask layer 203 as an etching mask. Thus, the portion of the surface of the to-be etched layer 201 may be exposed. The portion of the to-be-etched layer 201 may be subsequently etched to form the openings.

A process for etching the capping layer 204 may include forming a photoresist layer on the surface of the capping layer 204; patterning the photoresist layer to form patterns to expose the positions corresponding to subsequently formed openings; and etching the capping layer 204 until the second hard mask layer 203 is exposed using the patterned photoresist layer as an etching mask.

The second hard mask layer 203 may be etched using the etched capping layer 204 as an etching mask; and the first hard mask layer 202 may be etched using the etched second mask layer 203 as an etching mask. Thus, the etched first hard mask layer 202 may copy the patterns on the photoresist layer. The first hard mask layer 202 and the second hard mask layer 203 may have an etching selectivity, when the first hard mask layer 202 is being etched, the patterns of the second hard mask layer 203 may be stable. Thus, the patterns on the first mask layer 202 and the second hard mask layer 203 may be identical after the etching processes; and the patterns on the first hard mask layer 202 and the second hard mask layer 203 may be accurate. Therefore, openings with a relatively good morphology may be subsequently obtained.

In one embodiment, an anti-reflection layer (not shown) may be formed on the capping layer 204 before forming the photoresist layer. In certain other embodiments, if the capping layer 204 is omitted, the anti-reflection layer may be formed on the surface of the second hard mask layer 203, and the photoresist layer is formed on the anti-reflection layer.

In certain other embodiments, when only the first hard mask layer 202 is formed; and the second hard mask layer 203 is omitted, a process for etching the first hard mask layer 202 may include forming a photoresist layer on the first hard mask layer 202; patterning the photoresist layer to form patterns corresponding to the subsequently formed openings; and etching the first hard mask layer 202 until the to-be-etched layer 201 is exposed using the patterned photoresist layer as an etching mask. Before forming the photoresist layer, an anti-reflection layer may be formed on the first hard mask layer 202; and the photoresist layer may be formed on the anti-reflection layer.

Returning to FIG. 10, after etching the first hard mask layer 202, the second hard mask layer 203 and the capping layer 204, a plurality of openings may be formed in the to-be-etched layer 201 (S104). FIG. 8 illustrates a corresponding semiconductor structure.

As shown in FIG. 8, a plurality of openings 206 are formed in the to-be-etched layer 206. The openings 206 may be formed by etching the to-be-etched layer 201 using the etched first hard mask layer 202, the etched second mask layer 203 and the etched capping layer 204 as an etching mask. In one embodiment, the openings 206 may expose the surface of the substrate 200 and surfaces of the electrical interconnection structures in the surface of the substrate 200, thus subsequently formed conductive structures may connect with the semiconductor devices and structures in the substrate 200 through the electrically interconnection structures.

Various processes may be used to etch the to-be-etched layer 201, such as a dry etching process, a wet etching process, or an ion beam etching process, etc. In one embodiment, the to-be-etched layer 201 is etched by an anisotropic dry etching process.

Referring to FIG. 8, after etching the to-be-etched layer 201 to form the openings 206, the patterned photoresist layer may be removed by a wet chemical process or a plasma ashing process. Further, in one embodiment, after removing the photoresist layer, the anti-reflection layer and the capping layer 204 may also be removed by a wet chemical process. The process for etching the to-be-etched layer 201 and the processes for removing the photoresist layer, the anti-reflection layer and the capping layer 204 may produce by-products. The by-products may adhere on side surfaces and bottom surfaces of the openings 206; and cause subsequently formed conductive structures to have unacceptable performance. Thus, before subsequently forming the conductive structures, the side surfaces and the bottom surfaces of the openings 206 may need to be cleaned.

Returning to FIG. 10, after forming the openings 206, the side surfaces and the bottom surfaces of the openings 206 may be cleaned; and conductive structures 207 may be formed in the openings 206 (S105). FIG. 9 illustrates a corresponding semiconductor structure.

As shown in FIG. 9, a conductive structure 207 is formed in each of the openings 206 after cleaning the side surfaces and the bottom surfaces of the openings 206.

Various processes may used to clean the side surfaces and the bottom surfaces of the openings 206, such as a dry cleaning process, or a wet chemical cleaning process, etc. In one embodiment, a wet chemical cleaning process is used to clean the side surfaces and the bottom surfaces of the openings 206.

A variety of chemicals may be used for the wet chemical cleaning process. In one embodiment, a diluted hydrogen fluoride (HF) solution is used for the wet chemical cleaning process to clean the side surfaces and the bottom surfaces of the openings 206. A water to HF ratio of the diluted HF solution may be in a range of a proximately 300:1~1000:1.

Because the first hard mask layer 202 may be made of SiOC(N); and the to-be-etched layer 201 may be made of porous low-K dielectric material, an etching rate of the chemicals of the wet chemical cleaning process to the first hard mask layer 202 and an etching rate of the chemicals of the wet chemical cleaning process to the to-be-etched layer 201 may be identical, the side surface of the first hard mask layer 202 may level with the side surface of the opening 206 after the wet chemical cleaning process. That is, no undercut may be formed. Thus, a subsequently formed conductive film may completely cover the side surfaces of the openings 206; and voids may unlikely be formed between the conductive film and the side surfaces of the openings 206. Further, because the side surface of the first hard mask layer 202 may level with the side surface of the opening 206 after the wet chemical cleaning process, it may be easy for material of the conductive film to enter into the bottoms of the openings 206. Therefore, conductive structures subsequently formed from the conductive film may have a desired stability.

Further, because the first hard mask layer 202 may be made of SiOC(N), and the to-be-etched layer 201 may be made of porous low-K dielectric material, the first hard mask layer 202 and the to-be-etched layer 201 may have a significantly strong adhesion. Thus, peeling-off and bending of the first hard mask layer 202 may be prevented during etching the to-be-etched layer 201 and cleaning the openings 206 using wet chemicals. Therefore, the conductive film may completely cover the side surfaces and bottom surfaces of the openings 206; and conductive structures subsequently formed from the conductive film may have a desired stability.

The conductive structures 207 may be any appropriate type of structures. In one embodiment, the conductive structures 207 are conductive vias. Referring to FIG. 9, a process for forming the conductive structures 207 may include forming a barrier layer (not shown) on the side surfaces and the bottom surfaces of the openings 206; forming a conductive film on the barrier layer to fill up the openings 206; and polishing the conductive film and the barrier layer until the surface of the first hard mask layer 202 is exposed. Thus, the conductive structures 207 are formed in the openings 206.

Referring to FIG. 8 and FIG. 9, the second hard mask layer 203 may be used as a polishing stop layer. When the surface of the second hard mask layer 203 is exposed by the polishing process, the polishing process may be continued to overly etch the second hard mask layer 203 with a pre-determined thickness to expose the surface of the first hard mask layer 202. Thus, the second hard mask layer 203 may be used to protect the surface of the first hard mask layer 202 from being damaged by the polishing process.

Various processes may be used to polish the second hard mask layer 203 and the barrier layer, such as a chemical mechanical polishing (CMP) process, a mechanical polishing process, or an ion beam polishing process, etc. In one embodiment, the second hard mask layer 203 and the barrier layer are polished by a CMP process.

The barrier layer may be made of any appropriate material, such as one or more of TiN, TaN, Ta and Ti, etc. Various processes may be used to form the barrier layer, such as a PVD process, a CVD process, an ALD process, an FCVD, or an electrochemical plating (ECP) process, etc. In one embodiment, the barrier layer is formed by a PVD process.

The conductive film (conductive structures 207) may be made of any appropriate material, such as Cu, W, or Al, etc. In one embodiment, the conductive film is made of Cu. Various processes may be used to form the conductive film, such as a PVD process, a CVD process, an ALD process, an FCVD, or an electrochemical plating (ECP) process, etc. In one embodiment, the conductive film is formed by a PVD process and/or an ECP process. A process for forming the conductive film may include forming a Cu seed layer on the surface of the barrier layer by a PVD process; and forming a Cu layer filling up the openings 206 by an ECP process. Thus, the conductive layer having the Cu seed layer and the Cu layer may be formed.

Because the side surfaces of the first hard mask layer 202 may level with the side surfaces of the openings 206, when the barrier layer and the Cu seed layer are formed by the PVD process, it may be easy for source gases of the PVD process to enter into the openings 206. Further, directions of the source gases entering into the openings 206 may unlikely be blocked and changed, thus the barrier layer and the Cu seed layer may completely cover the side surfaces and the bottom surfaces of the openings 206; and the barrier layer and the Cu seed layer may have a good adhesion with the side surfaces and the bottom surfaces of the openings 206. Therefore, the conductive structures 207 may have a good morphology; and the performance of the conductive structures 207 may be stable.

Thus, a semiconductor structure may be formed by the above disclosed processes and methods; and the corresponding semiconductor is shown in FIG. 9. The semiconductor structure includes a substrate 200 and a to-be-etched layer 201 formed on the substrate 200. The semiconductor structure also includes a first hard mask layer 202 made of nitrogen-doped silicon oxycarbonate formed on the to-be-etched layer 201 and a plurality of conductive structures formed in the to-be-etched layer 201 and the first hard mask layer 202. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a substrate;
   forming a to-be-etched layer made of a porous low-K dielectric material including boron nitride on one surface of the substrate;
   forming a first hard mask layer made of nitrogen-doped silicon oxycarbide (SiOC(N)) directly on the to-be-etched layer;
   etching the first hard mask layer to have same patterns corresponding to positions of subsequently formed a plurality of openings;
   forming the plurality of openings through an entire thickness of the to-be-etched layer using the first hard mask layer as an etching;
   etching and cleaning a bottom surface of the openings along with side surfaces of both the to-be-etched layer and the first hard mask layer in the openings by a wet chemical cleaning process, to level the side surfaces of both the to-be-etched layer and the first hard mask layer with each other in the openings, wherein an etching rate of a solution of the wet chemical cleaning process to the first hard mask layer and an etching rate of the solution of the wet chemical cleaning process to the to-be-etched layer is identical; and
   after the wet chemical cleaning process, forming a conductive structure in each of the openings.

2. The method according to claim 1, further including:
   forming a second hard mask layer over the first hard mask layer, wherein:
   the second hard mask layer on the first hard mask layer is made of titanium nitride.

3. The method according to claim 2, after forming the second hard mask layer, further including:
forming a capping layer on the second hard mask layer.

4. The method according to claim 1, wherein etching the first hard mask layer further includes;
forming a photoresist layer on the first hard mask layer;
patterning the photoresist layer to have patterns corresponding to positions of the openings; and
etching the first hard mask layer using the photoresist layer as an etching mask.

5. The method according to claim 1, before forming the to-be-etched layer, further including:
forming an etching barrier layer on the surface of the substrate.

6. The method according to claim 1, wherein:
a plurality of the semiconductor devices and electrical interconnection structures are formed inside, or in the surface of the substrate.

7. The method according to claim 1, wherein:
the first hard mask layer is formed by a chemical vapor deposition process;
a gas source of the chemical vapor deposition process includes $SiH_4$, $CO_2$ and $N_2O$;
a flow of $SiH_4$ is in a range of 10 sccm to 10000 sccm;
a flow of $CO_2$ is in a range of 10 sccm to 10000 sccm;
a flow of $N_2O$ is in a range of 10 sccm to 10000 sccm;
a pressure of the chemical vapor deposition process is in a range of 0.1 Torr to 10 Torr; and
a power of a plasma source is in a range of 100 W to 5000 W if a plasma source is used in the chemical vapor deposition process.

8. The method according to claim 4, before forming the photoresist layer, further including:
forming an anti-reflection layer on the first hard mask layer.

9. The method according to claim 1, wherein forming the conductive structures further includes:
forming a barrier layer on side surfaces and bottom surfaces of the openings;
forming a conductive film on the barrier layer; and
polishing the conductive film and the barrier layer until the surface of the first hard mask layer is exposed.

10. The method according to claim 9, wherein:
the barrier layer is made of TiN, TaN, Ta, or Ti;
the barrier layer is formed by a physical vapor deposition process;
the conductive film is made of Cu, W, or Al; and
the conductive film is formed by a physical vapor deposition process or an electrochemical plating process.

11. The method according to claim 1, wherein:
the openings are formed by an anisotropic dry etching process.

12. The method according to claim 1, wherein:
a solution of the wet chemical cleaning process is a diluted hydrogen fluoride solution; and
a water to hydrogen fluoride ratio of the diluted hydrogen fluoride solution is in a range of 300:1 to 1000:1.

13. The method according to claim 5, wherein:
the etching barrier layer is made of silicon oxynitride.

14. A semiconductor structure, comprising:
a substrate;
a to-be-etched layer made of a porous low-K dielectric material including boron nitride formed on one surface of the substrate;
a first hard mask layer made of nitrogen-doped silicon oxycarbide (SiCO(N)) formed directly on the to-be-etched layer; and
a plurality of conductive structures formed in the to-be-etched layer and the first hard mask layer,
wherein the conductive structures are formed by:
etching the first hard mask layer to have same patterns corresponding to positions of subsequently formed a plurality of openings;
forming the plurality of openings through an entire thickness of the to-be-etched layer using the first hard mask layer as an etching mask;
etching and cleaning a bottom surface of the openings along with side surfaces of both the to-be-etched layer and the first hard mask layer in the openings by a wet chemical cleaning process, to level the side surfaces of both the to-be-etched layer and the first hard mask layer with each other in the openings, wherein an etching rate of a solution of the wet chemical cleaning process to the first hard mask layer and an etching rate of the solution of the wet chemical cleaning process to the to-be-etched layer is substantially same;
after the etching and cleaning step, forming a barrier layer to cover side surfaces and bottom surfaces of the openings;
forming a conductive film on the barrier layer to fill up the trenches; and
polishing the barrier layer and the conductive film until the surface of the first hard mask layer is exposed.

15. The semiconductor structure according to claim 14, wherein:
the to-be-etched layer is made of porous low dielectric constant material; and
the dielectric constant of the low dielectric constant material is lower than 2.6.

16. The semiconductor structure according to claim 14, wherein:
the conductive structures are made of Cu, W, or Al; and
the barrier layer is made of TiN, TaN, Ta, or Ti.

17. The semiconductor structure according to claim 14, wherein:
a plurality of semiconductor structures and electrical interconnection structures are formed inside or in the surface of the substrate.

18. The semiconductor device according to claim 14, wherein:
the first hard mask layer is formed by a chemical vapor deposition process; and
the conductive film is formed by a physical vapor deposition process or an electrical chemical plating process.

19. The semiconductor device according to claim 14, wherein:
the first hard mask layer is etched by an anisotropic dry etching process to form the openings.

* * * * *